United States Patent
Iizuka et al.

(10) Patent No.: US 12,479,048 B2
(45) Date of Patent: Nov. 25, 2025

(54) WAFER PROCESSING APPARATUS

(71) Applicant: DISCO CORPORATION, Tokyo (JP)

(72) Inventors: Kentaro Iizuka, Tokyo (JP); Kazuya Hirata, Tokyo (JP); Hayato Iga, Tokyo (JP); Hironobu Ozawa, Tokyo (JP); Mato Hattori, Tokyo (JP); Hideo Iwata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 112 days.

(21) Appl. No.: 18/529,690

(22) Filed: Dec. 5, 2023

(65) Prior Publication Data
US 2024/0194501 A1 Jun. 13, 2024

(30) Foreign Application Priority Data

Dec. 7, 2022 (JP) .................................. 2022-195562
Nov. 8, 2023 (JP) .................................. 2023-190773

(51) Int. Cl.
*B23K 26/53* (2014.01)
*B23K 26/06* (2014.01)
(Continued)

(52) U.S. Cl.
CPC .......... *B23K 26/53* (2015.10); *B23K 26/0608* (2013.01); *B23K 26/0676* (2013.01);
(Continued)

(58) Field of Classification Search
CPC ...................... H01L 21/67092; B23K 26/0676
See application file for complete search history.

(56) References Cited

U.S. PATENT DOCUMENTS

| 6,420,245 B1 * | 7/2002 | Manor | ................... B28D 5/022 |
| | | | 438/460 |
| 8,821,644 B2 * | 9/2014 | Sakuragi | ........... H01L 21/02087 |
| | | | 134/6 |

(Continued)

FOREIGN PATENT DOCUMENTS

| CN | 103862180 A | * | 6/2014 | ............. B23K 26/06 |
| DE | 102020216544 A1 | * | 7/2021 | ......... B23K 26/0006 |

(Continued)

OTHER PUBLICATIONS

Machine translation of Aoki Masashi JP 2010225976 A Oct. 7, 2010, FIT (Foreign Image and Text) (Year: 2010).*

*Primary Examiner* — Benjamin A Schiffman
(74) *Attorney, Agent, or Firm* — Greer, Burns & Crain, Ltd

(57) ABSTRACT

A processing apparatus includes a chuck table for holding a bonded wafer thereon, a grinding unit for grinding the bonded wafer, a cleaning unit for cleaning the bonded wafer, and a processing unit for removing a beveled portion of an outer circumferential end portion of the bonded wafer before the grinding unit grinds the bonded wafer. The processing unit includes a support for supporting the bonded wafer with a surface thereof being exposed and a laser beam applying unit for emitting a laser beam having a wavelength transmittable through the wafer. The laser beam applying unit applies the laser beam to the wafer supported on the support, from the exposed surface, while positioning a focused spot thereof within the outer circumferential excessive region of the wafer, to form a modified layer in the wafer along which to remove the beveled portion from the wafer.

20 Claims, 8 Drawing Sheets

(51) Int. Cl.
  *B23K 26/067*   (2006.01)
  *B23K 26/364*   (2014.01)
  *H01L 21/66*    (2006.01)
  *H01L 21/67*    (2006.01)
  *H01L 21/677*   (2006.01)
  *H01L 21/687*   (2006.01)
  *B23K 103/00*   (2006.01)

(52) U.S. Cl.
  CPC ...... *B23K 26/364* (2015.10); *H01L 21/67028* (2013.01); *H01L 21/67092* (2013.01); *H01L 21/67155* (2013.01); *H01L 21/67219* (2013.01); *H01L 21/67242* (2013.01); *H01L 21/67253* (2013.01); *H01L 21/67766* (2013.01); *H01L 21/68728* (2013.01); *H01L 22/14* (2013.01); *B23K 2103/56* (2018.08)

(56) References Cited

U.S. PATENT DOCUMENTS

| | | | | |
|---|---|---|---|---|
| 9,138,913 | B2* | 9/2015 | Arai | B41M 5/26 |
| 9,255,894 | B2* | 2/2016 | VanHoomissen | G01N 21/9505 |
| 9,815,138 | B2* | 11/2017 | Hirata | B23K 26/0604 |
| 9,929,018 | B2* | 3/2018 | Bieck | H01L 21/6704 |
| 10,576,585 | B1* | 3/2020 | Donofrio | B23K 26/0006 |
| 10,870,176 | B2* | 12/2020 | Hirata | B23K 26/0823 |
| 11,222,822 | B2* | 1/2022 | Yamamoto | H01L 21/78 |
| 11,819,950 | B2* | 11/2023 | Komatsu | B23K 26/0823 |
| 11,881,407 | B2* | 1/2024 | Nagaya | H01L 21/2683 |
| 11,958,132 | B2* | 4/2024 | Hirata | B23K 26/0622 |
| 12,011,781 | B2* | 6/2024 | Ungaro | B23K 26/53 |
| 12,151,401 | B2* | 11/2024 | Komatsu | B28D 5/0064 |
| 12,191,138 | B2* | 1/2025 | Tsuchiya | H01L 21/6836 |
| 12,251,776 | B2* | 3/2025 | Flamm | B23K 26/0648 |
| 12,275,091 | B2* | 4/2025 | Korematsu | B23K 26/08 |
| 12,288,682 | B2* | 4/2025 | Kim | B23K 26/083 |
| 2004/0065647 | A1* | 4/2004 | Kubo | H01L 21/67092 257/E23.179 |
| 2005/0199592 | A1* | 9/2005 | Iri | B23K 26/40 219/121.6 |
| 2008/0128396 | A1* | 6/2008 | Shigematsu | B23K 26/702 219/121.67 |
| 2021/0197319 | A1* | 7/2021 | Hirata | B23K 26/352 |
| 2023/0036386 | A1* | 2/2023 | Taylor | B23K 26/0652 |
| 2023/0048318 | A1* | 2/2023 | Hirata | B23K 26/38 |
| 2023/0050807 | A1* | 2/2023 | Iga | B23K 26/032 |
| 2023/0054570 | A1* | 2/2023 | Sakamoto | B23K 26/0648 |
| 2023/0066601 | A1* | 3/2023 | Iga | B23K 26/0853 |
| 2024/0087901 | A1* | 3/2024 | Sekiya | B23K 26/0853 |
| 2024/0112902 | A1* | 4/2024 | Iga | H01L 21/78 |
| 2024/0120215 | A1* | 4/2024 | Iga | B24B 7/228 |
| 2024/0128087 | A1* | 4/2024 | Iga | H01L 21/6835 |
| 2024/0145248 | A1* | 5/2024 | Iga | H01L 22/12 |
| 2024/0297052 | A1* | 9/2024 | Tanaka | H01L 21/78 |
| 2024/0304448 | A1* | 9/2024 | Tanaka | H01L 21/304 |
| 2024/0304457 | A1* | 9/2024 | Tanaka | H01L 21/304 |
| 2024/0339326 | A1* | 10/2024 | Chen | H01L 21/67051 |
| 2024/0399494 | A1* | 12/2024 | Hirata | B23K 26/38 |
| 2025/0014949 | A1* | 1/2025 | Mizutani | H01L 22/12 |

FOREIGN PATENT DOCUMENTS

| | | | | |
|---|---|---|---|---|
| JP | 2005032804 | A | * | 2/2005 |
| JP | 2010225976 | A | | 10/2010 |
| JP | 2013237115 | A | * | 11/2013 |
| JP | 2016096295 | A | | 5/2016 |
| JP | 2020136662 | A | * | 8/2020 ....... H01L 21/67242 |
| KR | 2020099075 | A | * | 8/2020 ............ B23K 26/53 |

* cited by examiner

FIG.9A
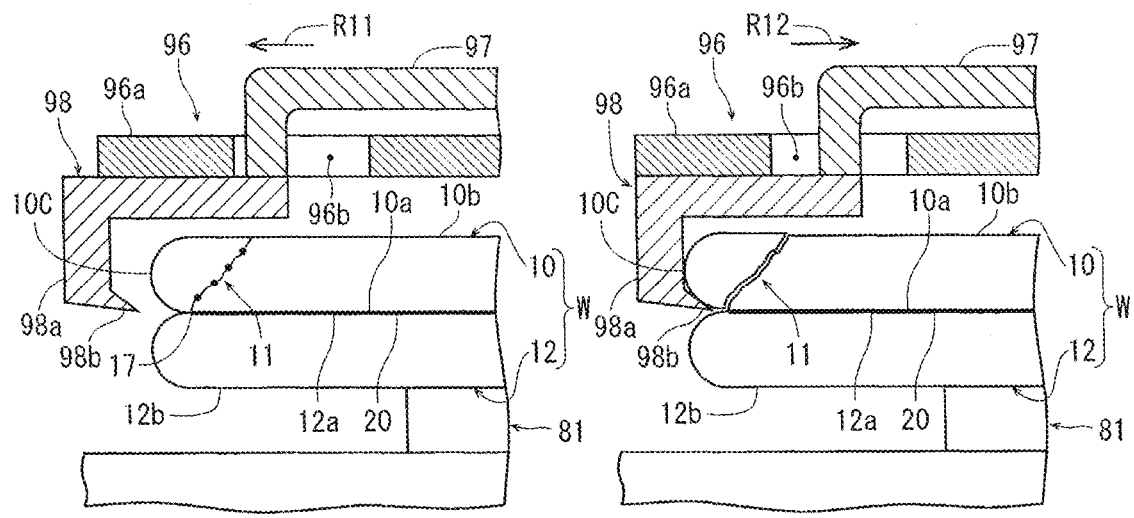
FIG.9B
FIG.10A
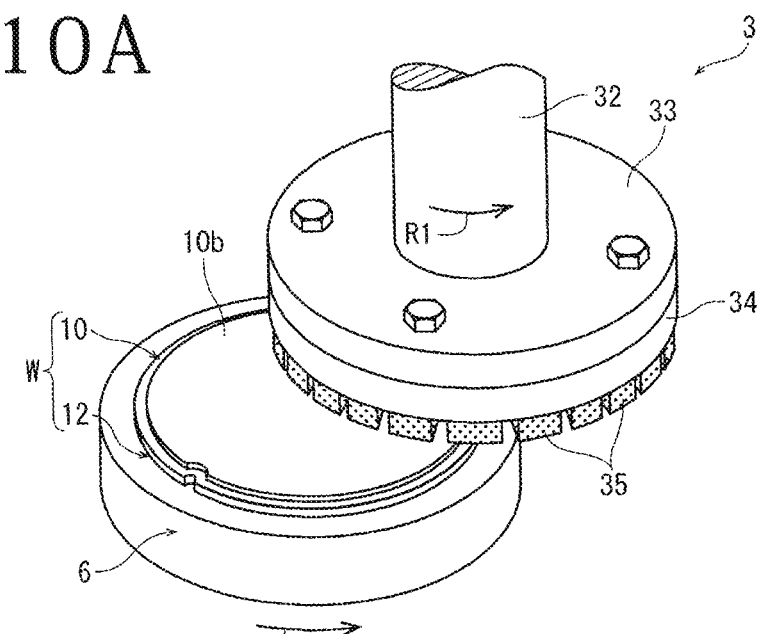
FIG.10B
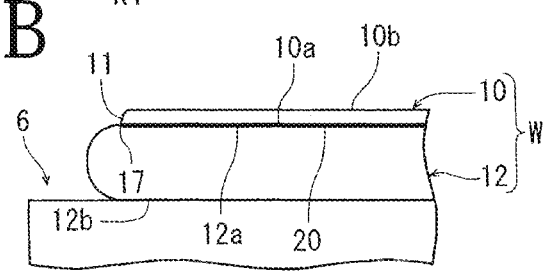

WAFER PROCESSING APPARATUS

BACKGROUND OF THE INVENTION

Field of the Invention

The present invention relates to a processing apparatus for processing a wafer.

Description of the Related Art

Wafers with a plurality of devices such as integrated circuits (ICs) or large-scale integration (LSI) circuits constructed in respective areas demarcated in their face side by a grid of projected dicing lines are divided into individual device chips by a dicing apparatus. The device chips will be used in electronic appliances such as cellular phones and personal computers.

Heretofore, there has been known a technology in which, for increased device performance, two wafers with patterns formed thereon are affixed to each other, making up a bonded wafer, and the reverse side of one of the affixed wafers is ground to thin down the bonded wafer.

When one surface of a wafer that has a beveled outer circumferential edge portion is ground to thin down the wafer, the beveled outer circumferential edge portion is shaped into a sharp knife edge, which tends to injure an operator and/or to give rise to cracks developing into the ground wafer, possibly causing damage to device chips to be fabricated from the wafer.

In view of the above problem, there has been proposed a technology in which a cutting blade or a grindstone is directly positioned on a beveled outer circumferential edge portion of a wafer to be thinned down by grinding, to remove the beveled outer circumferential edge portion, thereby preventing a knife edge from being formed at the time when one surface of the wafer is ground to thin down the wafer (see, for example, JP 2010-225976A and JP 2016-96295A).

SUMMARY OF THE INVENTION

However, the technology disclosed in JP 2010-225976A and JP 2016-96295A is problematic in that it takes considerable time to remove the beveled outer circumferential edge portion with the cutting blade or the grindstone, resulting in poor productivity, and, in addition, if the technology is applied to a bonded wafer made up of two wafers affixed to each other, then, when one of the wafers is ground, the other wafer is liable to be damaged.

The problem that it takes considerable time to remove the beveled outer circumferential edge portion with the cutting blade or the grindstone arises when a bonded wafer made up of two wafers affixed to each other is processed to remove its beveled outer circumferential edge portion and also when a single-layer wafer is processed to remove its beveled outer circumferential edge portion.

It is therefore an object of the present invention to provide a processing apparatus that will not form a knife edge on a wafer when it grinds the reverse side of the wafer and will solve the problem, efficiently without making productivity lower, of injuring an operator and/or giving rise to cracks developing in unintended directions into the ground wafer, possibly causing damage to device chips to be fabricated from the wafer.

In accordance with an aspect of the present invention, there is provided a processing apparatus for processing a wafer including in a face side thereof a device region containing a plurality of devices therein and an outer circumferential excessive region including a beveled portion on an outer circumferential end portion thereof, the processing apparatus including a chuck table for holding the wafer thereon, a grinding unit for grinding the wafer held on the chuck table, a cleaning unit for cleaning the wafer, and a processing unit for performing a process of removing the beveled portion of the outer circumferential end portion of the wafer before the grinding unit grinds the wafer. The processing unit includes a support for supporting the wafer with a surface thereof being exposed and a laser beam applying unit for emitting a laser beam having a wavelength transmittable through the wafer, and the laser beam applying unit applies the laser beam to the wafer supported on the support, from the exposed surface, while positioning a focused spot thereof within the outer circumferential excessive region of the wafer, to form a modified layer in the wafer along which to remove the beveled portion from the wafer.

Preferably, the laser beam applying unit applies a plurality of laser beams to the wafer while forming respective focused spots thereof in a downwardly stepped array from an uppermost one toward a lowermost one of the focused spots within the wafer in such a manner as to be progressively closer outwardly of the wafer to another surface, opposite the exposed surface, of the wafer. Preferably, a crack extending from the lowermost one of the focused spots is formed in the wafer and reaches the other surface of the wafer. Preferably, the processing apparatus further includes a cassette table for holding a cassette placed thereon, the cassette storing a plurality of wafers therein, a first delivery mechanism for delivering a wafer from the cassette placed on the cassette table, a temporary rest table for temporarily holding the wafer delivered from the cassette by the first delivery mechanism, and a second delivery mechanism for delivering the wafer from the temporary rest table to the chuck table.

Preferably, the support of the processing unit includes the temporary rest table, and the laser beam applying unit is disposed adjacent to the temporary rest table. Preferably, the processing apparatus further includes a beveled portion removing device for removing the beveled portion along the modified layer formed by the processing unit, the beveled portion removing device being disposed adjacent to the processing unit. Preferably, the wafer is a bonded wafer having a first wafer including in a face side thereof a device region containing a plurality of devices therein and an outer circumferential excessive region including a beveled portion on an outer circumferential end portion thereof, and a second wafer having a face side and a reverse side thereof, the face side or the reverse side of the second wafer being affixed to the face side of the first wafer by a joint layer interposed therebetween.

Preferably, if it is decided that the electric resistivity of the wafer impairs the formation of the modified layer by the processing unit, then a grinding process is performed on a reverse side, opposite the face side, of the wafer before the processing unit performs the process of removing the beveled portion of the outer circumferential end portion of the wafer.

Preferably, the processing apparatus further includes an electric resistance measuring instrument for measuring the electric resistivity of the wafer. It is determined whether or not the electric resistivity of the wafer measured by the electric resistance measuring instrument impairs the formation of the modified layer by the processing unit, and if it is decided that the electric resistivity of the wafer is of a value that impair the formation of the modified layer by the processing unit, then the grinding process is performed on the reverse side of the wafer before the processing unit performs the process of removing the beveled portion of the outer circumferential end portion of the wafer.

Preferably, the grinding process performed on the reverse side of the wafer before the processing unit performs the process of removing the beveled portion of the outer circumferential end portion of the wafer is continued until the wafer is ground to a thickness enough to decide that the electric resistivity of the wafer does not impair the formation of the modified layer.

With the processing apparatus according to the present invention, no knife edge formed on the wafer when the reverse side thereof is ground. Therefore, the operator is prevented from being injured, and cracks are prevented from unduly developing into the first wafer and causing damage to devices to be fabricated from the wafer. Further, as the processing apparatus includes the processing unit for forming the modified layer and the crack in the wafer with the laser beam for removing beveled portions therealong, the processing apparatus can efficiently remove the beveled portion from the wafer. In addition, the processing apparatus achieves increased productivity because it is free of the trouble of delivering a cassette storing wafers whose beveled portions have been removed to a separate grinding apparatus.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 9A is an enlarged fragmentary side elevational view, partly in cross section, illustrating the manner in which the beveled portion removing device is positioned with respect to the wafer;

FIG. 9B is an enlarged fragmentary side elevational view, partly in cross section, illustrating the manner in which the beveled portion removing device removes the beveled portion;

FIG. 10A is a perspective view illustrating the manner in which a coarsely grinding step is carried out on the wafer;

FIG. 10B is an enlarged fragmentary side elevational view of the wafer that has been thinned down by the coarsely grinding step.

DETAILED DESCRIPTION OF THE PREFERRED EMBODIMENT

Figure 1:
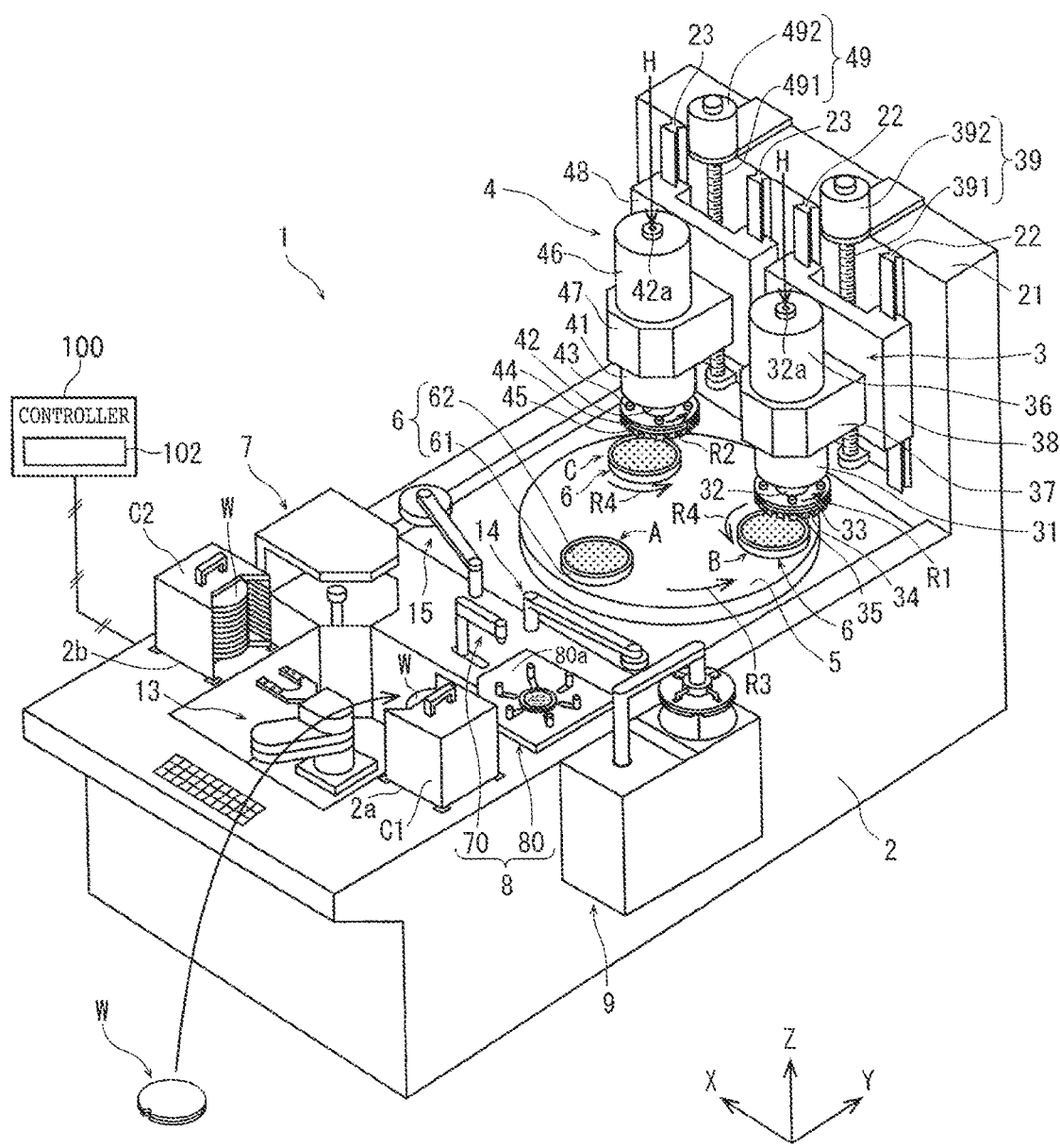
FIG. 1 is a perspective view of a processing apparatus according to an embodiment of the present invention.

A processing apparatus according to a preferred embodiment of the present invention will be described in detail hereinbelow with reference to the accompanying drawings. FIG. 1 illustrates in perspective the processing apparatus, denoted by 1, according to the present embodiment. In FIG. 1, the laser processing apparatus 1 is illustrated in reference to a three-dimensional coordinate system having an X-axis, a Y-axis, and a Z-axis. The X-axis, indicated by an arrow X, and the Y-axis, indicated by an arrow Y, extend horizontally perpendicularly to each other. The Z-axis, indicated by an arrow Z, extends vertically perpendicularly to the X-axis and the Y-axis. The X-axis and the Y-axis jointly define a horizontal XY plane that lies essentially horizontally. The X-axis, the Y-axis, and the Z-axis are also illustrated in some other figures.

As illustrated in FIG. 1, the processing apparatus 1 includes at least a turntable 5 including a plurality of chuck tables 6 for holding respective workpieces to be described later, a coarsely grinding unit 3 and a finishingly grinding unit 4 provided as grinding units for grinding workpieces held respectively on two of the chuck tables 6, a cleaning unit 7 for cleaning a workpiece, and a processing unit 8 for removing a beveled portion from an outer circumferential end portion of a workpiece before the workpiece is ground by the grinding units. The processing unit 8 includes a laser beam applying unit 70 for applying a laser beam and a support 80 for supporting a workpiece thereon while exposing one surface of the workpiece upwardly.

Figure 2A:
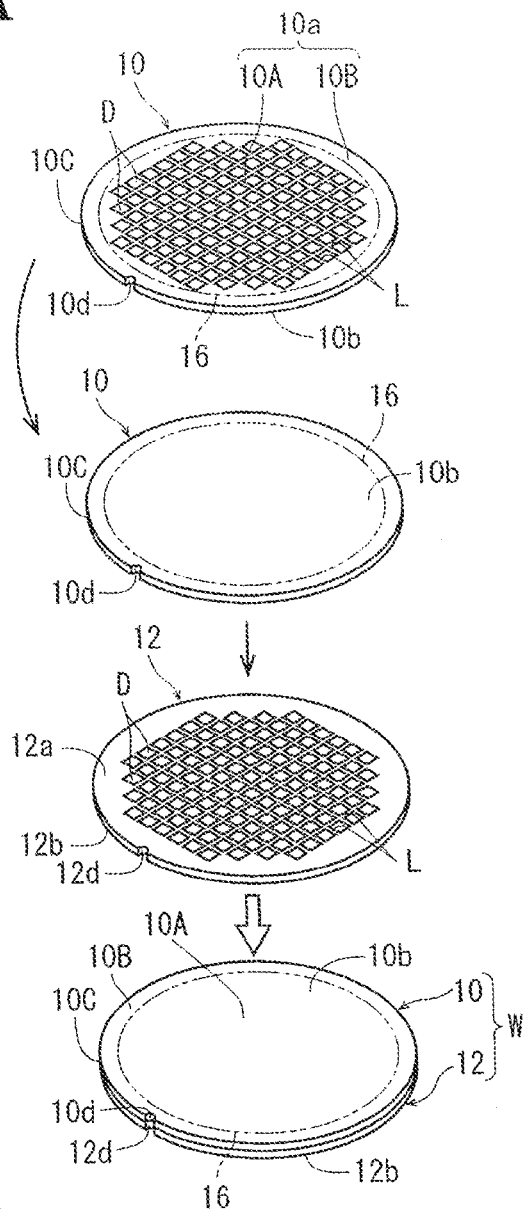
FIG. 2A is a perspective view illustrating an example of a wafer to be processed by the processing apparatus illustrated in FIG. 1.

Each of the workpieces to be processed by the processing apparatus 1 according to the present embodiment is a bonded wafer W illustrated in a lowermost section of FIG. 2A, for example. The bonded wafer W is of a circular shape having a diameter of 300 mm, for example, and includes a stacked wafer assembly including a first wafer 10 and a second wafer 12 that are affixed to each other. The first wafer 10 is a silicon-on-insulator (SOi) wafer including an oxide layer within a silicon substrate, for example. The first wafer 10 has a plurality of devices D constructed in respective areas demarcated on a face side 10a thereof by a grid of projected dicing lines L. The face side 10a of the first wafer 10, which is illustrated as facing upwardly in an uppermost section of FIG. 2A, includes a device region 10A extending around its center and containing the devices D and an outer circumferential excessive region 10B surrounding the device region 10A. The first wafer 10 also has a reverse side 10b opposite the face side 10a. The outer circumferential excessive region 10B includes an annular beveled portion 10C (see also FIG. 2B) on an outer circumferential end portion thereof. The annular beveled portion 10C is of a curved shape that radially outwardly protrudes. The outer circumferential excessive region 10B also has a notch 10d defined in its outer circumferential end portion as an indicator of the crystal orientation of the first wafer 10. FIG. 2A illustrates an annular boundary line 16 indicated on the first wafer 10 by a two-dot-and-dash line. The annular boundary line 16 is depicted as a marking dividing the device region 10A and the outer circumferential excessive region 10B from each other. The annular boundary line 16 is hypothetically added for illustrative purposes in FIG. 2A and is not actually present on the face side 10a of the wafer 10.

Figure 2B:
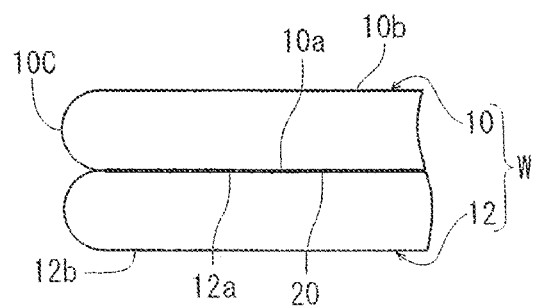
FIG. 2B is an enlarged fragmentary side elevational view of the wafer illustrated in FIG. 2A.

The second wafer 12 affixed to the first wafer 10 is essentially identical in structure to the first wafer 10. The second wafer 12 has a notch 12d defined in its outer circumferential end portion as indicating the crystal orientation of the second wafer 12, as with the first wafer 10. Other details of the second wafer 12 will be omitted from detailed description, and those parts of the second wafer 12 which are identical to those of the first wafer 10 are denoted by identical reference characters. The bonded wafer W is constructed as follows. As illustrated in FIGS. 2A and 2B, the first wafer 10 that is depicted in the uppermost section of FIG. 2A is overturned, causing the reverse side 10b to face upwardly and the face side 10a to face downwardly, as depicted directly below. Then, the face side 10a of the first wafer 10 and the face side 12a of the second wafer 12 are affixed to each other by a suitable adhesive, as depicted further below, making up the bonded wafer W where a joint layer 20 (see FIG. 2B) provided by the adhesive is interposed between the first wafer 10 and the second wafer 12. The notch 10d of the first wafer 10 and the notch 12d of the second wafer 12 are aligned with each other (see the lowermost section of FIG. 2A), representing the crystal orientations of the first wafer 10 and the second wafer 12 which are directed in the same direction.

Figure 3A:
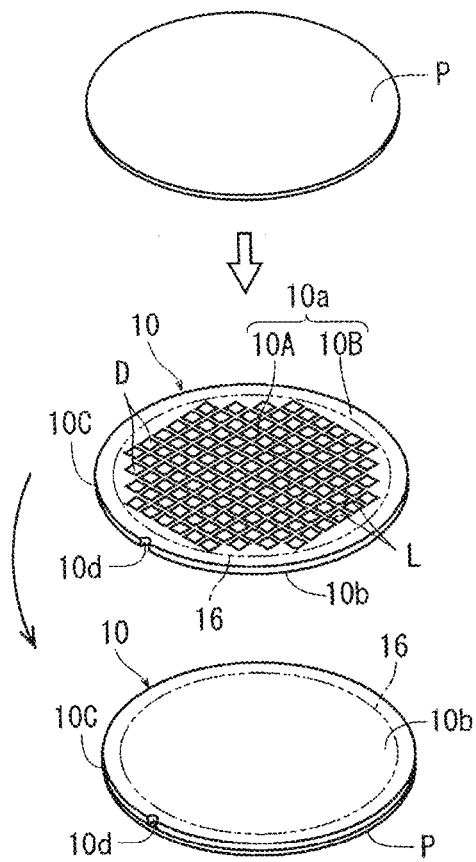
FIG. 3A is a perspective view illustrating another example of the wafer to be processed by the processing apparatus illustrated in FIG. 1.
Figure 3B:
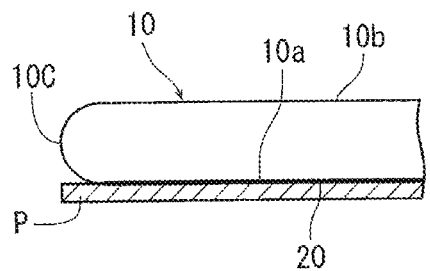
FIG. 3B is an enlarged fragmentary side elevational view of the wafer illustrated in FIG. 3A.

The workpiece to be processed by the processing apparatus 1 according to the present embodiment is not limited to the bonded wafer W, and may be a bonded wafer in which the face side 10a of the first wafer 10 and the reverse side 12b of the second wafer 12 are affixed to each other, or may be a single-layer wafer including the first wafer 10, as illustrated in FIG. 3A. If the workpiece is a single-layer wafer, then it is preferable to affix a rigid plate P (see an uppermost section of FIG. 3A) that is of substantially the same dimensions as the first wafer 10 to the face side 10a of the first wafer 10 with a joint layer 20 provided by a suitable adhesive being interposed therebetween, as illustrated in FIG. 3B. In the present embodiment to be described below, the bonded wafer W (see FIG. 2B) will be described as the workpiece to be processed by the processing apparatus 1.

As illustrated in FIG. 1, the processing apparatus 1 includes an apparatus housing 2 shaped as a substantially rectangular parallelepiped. The apparatus housing 2 includes an upstanding support wall 21 erected along the Z-axis from a rear end thereof along the Y-axis. Two pairs of guide rails 22 and 23 extending along the Z-axis are disposed on an inner side surface of the support wall 21. The coarsely grinding unit 3 is movably mounted on the guide rails 22 for vertical movement along the Z-axis, whereas the finishingly grinding unit 4 is movably mounted on the guide rails 23 for vertical movement along the Z-axis.

The coarsely grinding unit 3 includes a unit housing 31, a wheel mount 33 disposed on the lower end of a rotational shaft 32 that is rotatably supported in the unit housing 31, a coarsely grinding wheel 34 that is mounted on the wheel mount 33 and that supports an annular array of coarse grindstones 35 secured to a lower surface of the coarsely grinding wheel 34, an electric motor 36 that is mounted on the upper end of the unit housing 31 and that is for rotating the wheel mount 33 about its vertical central axis in a direction indicated by an arrow R1, and a movable base 38 having a front surface supporting thereon the unit housing 31 with a support block 37 interposed therebetween.

The movable base 38 has a pair of vertical slots defined in a rear surface opposite the front surface thereof. The slots are slidably fitted over the respective guide rails 22 on the support wall 21, so that the coarsely grinding unit 3 is vertically movably supported on the guide rails 22. The processing apparatus 1 includes a grinding feed mechanism 39 as lifting and lowering means for lifting and lowering the movable base 38 along the guide rails 22. The grinding feed mechanism 39 includes an externally threaded rod 391 that extends vertically parallel to and between the guide rails 22 and that is rotatably supported on the support wall 21, a stepping motor 392 for rotating the externally threaded rod 391 about its vertical central axis, and an undepicted internally threaded block mounted on the rear surface of the movable base 38 and operatively threaded over the externally threaded rod 391. When the stepping motor 392 is energized, it rotates the externally threaded rod 391 in one direction or the other about its vertical central axis, causing the internally threaded block to move the coarsely grinding unit 3 in a vertical direction along the Z-axis.

The finishingly grinding unit 4 is essentially identical in structure to the coarsely grinding unit 3. The finishingly grinding unit 4 includes a unit housing 41, a wheel mount 43 disposed on the lower end of a rotational shaft 42 that is rotatably supported in the unit housing 41, a finishingly grinding wheel 44 that is mounted on the wheel mount 43 and that supports an annular array of finishing grindstones 45 secured to a lower surface of the finishingly grinding wheel 44, an electric motor 46 that is mounted on the upper end of the unit housing 41 and that is for rotating the wheel mount 43 about its vertical central axis in a direction indicated by an arrow R2, and a movable base 48 having a front surface supporting thereon the unit housing 41 with a support block 47 interposed therebetween.

The movable base 48 has a pair of vertical slots defined in a rear surface opposite the front surface thereof. The slots are slidably fitted over the respective guide rails 23 on the support wall 21, so that the finishingly grinding unit 4 is vertically movably supported on the guide rails 23. The processing apparatus 1 includes a grinding feed mechanism 49 as lifting and lowering means for lifting and lowering the movable base 48 along the guide rails 23. The grinding feed mechanism 49 includes an externally threaded rod 491 that extends vertically parallel to and between the guide rails 23 and that is rotatably supported on the support wall 21, a stepping motor 492 for rotating the externally threaded rod 491 about its vertical central axis, and an undepicted internally threaded block mounted on the rear surface of the movable base 48 and operatively threaded over the externally threaded rod 491. When the stepping motor 492 is energized, it rotates the externally threaded rod 491 in one direction or the other about its vertical central axis, causing the internally threaded block to move the finishingly grinding unit 4 in a vertical direction along the Z-axis.

An undepicted grinding water supply unit for supplying grinding water H to the lower surfaces of the grinding wheels 34 and 44 is fluidly connected to ends 32a and 42a of the respective rotational shafts 32 and 42 that are rotatable by the electric motors 36 and 46, respectively.

The turntable 5 is intermittently rotatably mounted on the apparatus housing 2 in front of the support wall 21 and lies substantially flush with an upper surface of the apparatus housing 2. The turntable 5 that is shaped as a disk having a relatively large diameter is rotatable in a direction indicated by an arrow R3 about its vertical central axis by an undepicted rotating mechanism housed in the apparatus housing 2. The chuck tables 6, or three chuck tables 6 in the illustrated embodiment, are disposed as holding means for holding respective bonded wafers W at respective angular positions that are circumferentially spaced through angles of 120 degrees from each other. The chuck tables 6 are rotatable in a direction indicated by an arrow R4 about their vertical central axes by respective undepicted rotating mechanisms. Each of the chuck tables 6 has a disk-shaped suction chuck 61 that is made of an air-permeable porous material and that provides a holding surface and a frame 62 surrounding the suction chuck 61.

When the turntable 5 is intermittently rotated about its vertical central axis in the direction indicated by the arrow R3, each of the chuck tables 6 is moved to and positioned in three successive angularly spaced zones, i.e., a workpiece loading and unloading zone A, a coarsely grinding zone B, and a finishingly grinding zone C. After the finishingly grinding zone C, each of the chuck tables 6 moves to the workpiece loading and unloading zone A again upon rotation of the turntable 5.

The processing apparatus 1 further includes a first cassette C1 disposed on one side of a longitudinal central axis of the apparatus housing 2 which is aligned with the workpiece loading and unloading zone A, for storing therein a plurality of bonded wafers W to be processed, i.e., ground, a cassette table 2a that is mounted on the apparatus housing 2 and that supports the first cassette C1 placed thereon, a second cassette C2 disposed on the other side of the longitudinal central axis of the apparatus housing 2 and aligned with the first cassette C1 along the X-axis, for storing therein a plurality of bonded wafers W that have been processed, i.e., ground, a cassette table 2b that is mounted on the apparatus housing 2 and that supports the second cassette C2 placed thereon, a first delivery mechanism 13 that is mounted on the apparatus housing 2 and that is for unloading a bonded wafer W from the first cassette C1, temporarily placing the bonded wafer W on a temporary rest table 80a, which is provided as a part of the support 80 of the processing unit 8, on the apparatus housing 2, and loading a bonded wafer W from the cleaning unit 7 that is disposed between the workpiece loading and unloading zone A and the second cassette C2, into the second cassette C2, a second delivery mechanism 14 that is mounted on the apparatus housing 2 and that is for delivering a bonded wafer W to be ground, from the temporary rest table 80a onto the chuck table 6 positioned in the workpiece loading and unloading zone A, and a third delivery mechanism 15 that is mounted on the apparatus housing 2 and that is for delivering a bonded wafer W that has been ground, from the chuck table 6 positioned in the workpiece loading and unloading zone A to the cleaning unit 7. The support 80 of the processing unit 8 is disposed on the apparatus housing 2 between the first cassette C1 and the workpiece loading and unloading zone A. The laser beam applying unit 70 of the processing unit 8 is disposed on the apparatus housing 2 at a position adjacent to the support 80 to apply a laser beam to a bonded wafer W supported on the support 80.

Figure 4:
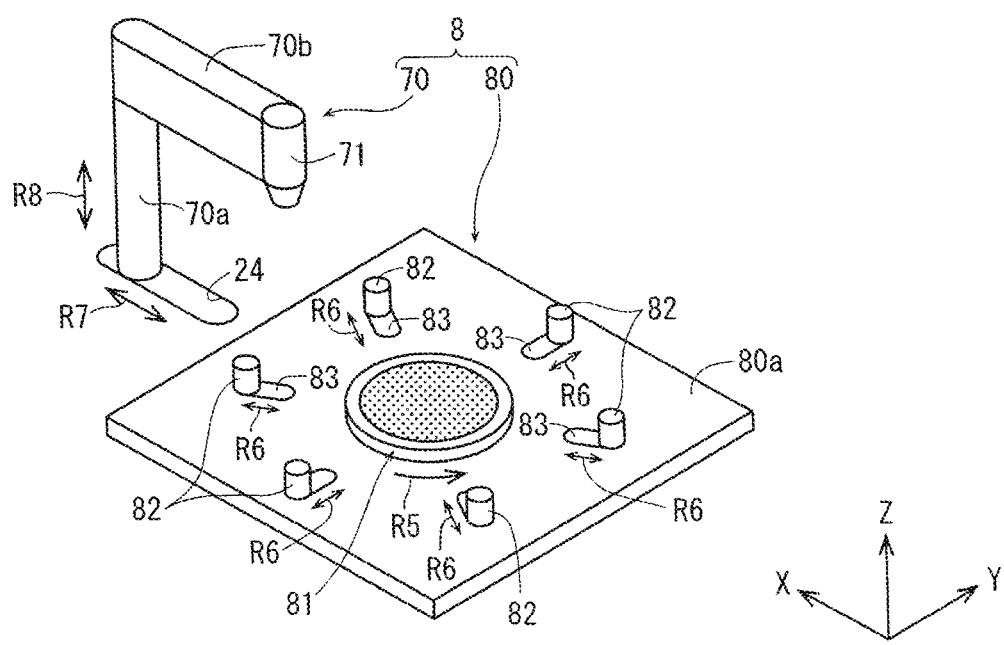
FIG. 4 is a perspective view of a processing unit mounted on the processing apparatus illustrated in FIG. 1.

FIG. 4 illustrates the processing unit 8 in perspective. As described above, the support 80 of the processing unit 8 includes the temporary rest table 80a. The support 80 also includes a chuck table 81 protruding upwardly from a central area of the temporary rest table 80a and a plurality of movable pins 82 disposed on the temporary rest table 80a around the chuck table 81. The chuck table 81 is rotatable in a direction indicated by an arrow R5 about its vertical central axis by an undepicted rotating mechanism housed in the apparatus housing 2. The chuck table 81 has an upper surface made of an air-permeable porous material. The chuck table 81 is fluidly connected to undepicted suction means. When the suction means is actuated, it generates a negative pressure that is transmitted to the upper surface of the chuck table 81 for thereby holding a bonded wafer W under suction thereon. The pins 82 are movably disposed in respective oblong holes 83 defined in the temporary rest table 80a and directed radially toward the center of the chuck table 81. The pins 82 are movable back and forth in directions indicated by an arrow R6 along the respective oblong holes 83 by respective drive mechanisms. When a bonded wafer W is placed on the chuck table 81, the drive mechanisms are actuated to synchronously move the pins 82 along the oblong holes 83 toward the center of the chuck table 81 until the pins 82 abut uniformly against an outer circumferential edge of the bonded wafer W on the chuck table 81, whereupon the center of the bonded wafer W is aligned with the center of the chuck table 81.

The laser beam applying unit 70 includes a vertical rod 70a, a horizontal arm 70b extending horizontally from the upper end of the vertical rod 70a in overhanging relation to the support 80, a beam condenser 71 disposed on the distal end of the horizontal arm 70b, and an optical system to be described later. The vertical rod 70a is horizontally movable by an undepicted X-axis moving mechanism in directions indicated by an arrow R7 in and along a slot 24 defined in the apparatus housing 2 along the X-axis. The vertical rod 70a is vertically movable by an undepicted Z-axis moving mechanism in directions indicated by an arrow R8. Therefore, the vertical rod 70a can be moved to position the beam condenser 71 mounted on the distal end of the horizontal arm 70b at a desired position along the X-axis and the Z-axis over the temporary rest table 80a. The slot 24 has a longitudinal central axis aligned with the center of the chuck table 81 such that the beam condenser 71 can be moved on and along a line extending through the center of the chuck table 81 across the outer circumferential edge of a bonded wafer W placed on the chuck table 81.

Figure 5:
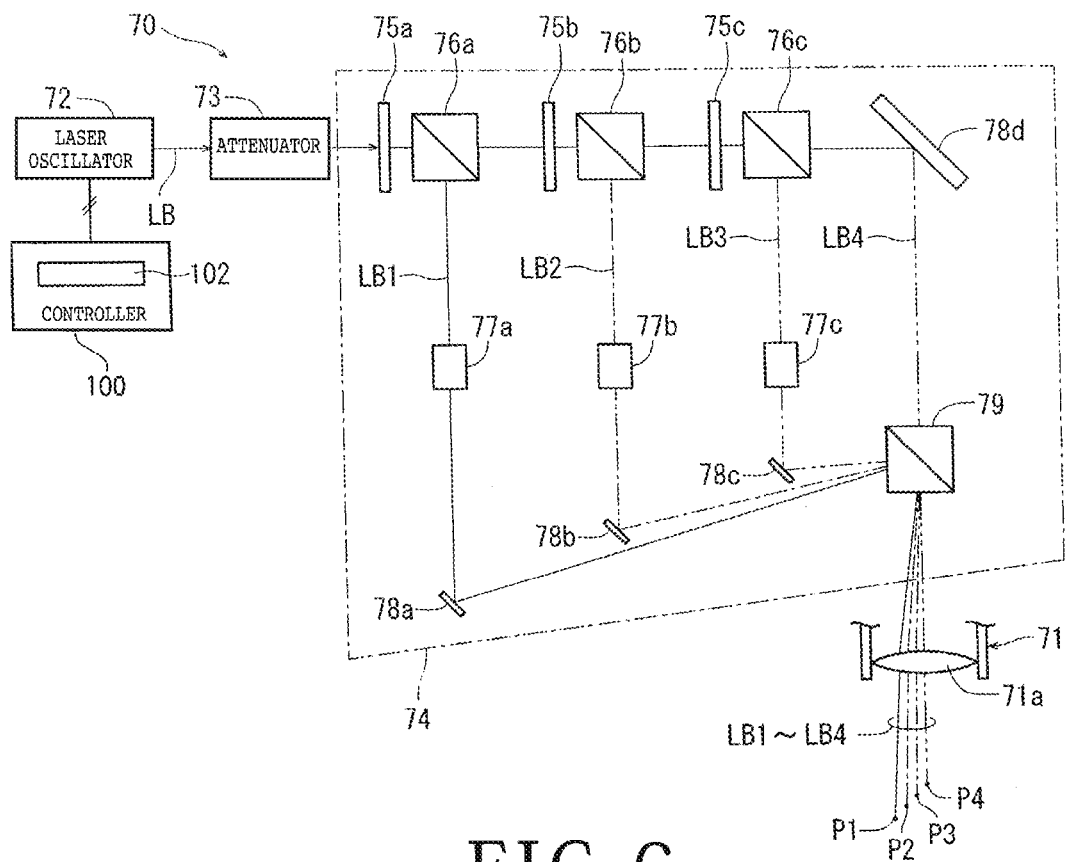
FIG. 5 is a block diagram of an optical system of a laser beam applying unit of the processing unit illustrated in FIG. 4.

The laser beam applying unit 70 can process, with a laser beam, a bonded wafer W centered on the chuck table 81 of the temporary rest table 80a. FIG. 5 illustrates in block form the optical system of the laser beam applying unit 70 illustrated in FIG. 4.

As illustrated in FIG. 5, the laser beam applying unit 70 includes a laser oscillator 72 for emitting a laser beam LB, an attenuator 73 for regulating the output power of the laser beam LB emitted from the laser oscillator 72, and a focused spot forming unit 74 for dividing the laser beam LB from the attenuator 73 into a plurality of laser beams and forming a plurality of focused spots of the respective laser beams in a downwardly stepped array within the bonded wafer W on the chuck table 81.

The focused spot forming unit 74 includes a first half-wave plate 75a, a first beam splitter 76a, a second half-wave plate 75b, a second beam splitter 76b, a third half-wave plate 75c, a third beam splitter 76c, a first beam expander 77a, a second beam expander 77b, a third beam expander 77c, a first reflecting mirror 78a, a second reflecting mirror 78b, a third reflecting mirror 78c, a fourth reflecting mirror 78d, and a fourth beam splitter 79, for example.

The laser beam LB emitted from the laser oscillator 72 and transmitted through the attenuator 73 is applied through the first half-wave plate 75a to the first beam splitter 76a. The angle of rotation of the first half-wave plate 75a is adjusted to cause the first beam splitter 76a to divide a first branch laser beam LB1 (s-polarized beam), whose amount of light is a quarter of that of the laser beam LB, from the laser beam LB, and to direct the first branch laser beam LB1 to the first beam expander 77a. The remaining laser beam (p-polarized beam) that has not been divided by the first beam splitter 76a is transmitted through the second half-wave plate 75b to the second beam splitter 76b. The angle of rotation of the second half-wave plate 75b is adjusted to cause the second beam splitter 76b to divide a second branch laser beam LB2 (s-polarized beam), whose amount of light is a quarter of that of the laser beam LB, from the remaining laser beam, and to direct the second branch laser beam LB2 to the second beam expander 77b.

The remaining laser beam (p-polarized beam) that has not been divided by the second beam splitter 76b is transmitted through the third half-wave plate 75c to the third beam splitter 76c. The angle of rotation of the third half-wave plate 75c is adjusted to cause the third beam splitter 76c to divide a third branch laser beam LB3 (s-polarized beam), whose amount of light is a quarter of that of the laser beam LB, from the remaining laser beam, and to direct the third branch laser beam LB3 to the third beam expander 77c.

The remaining laser beam (p-polarized beam) that has not been divided by the third beam splitter 76c is transmitted as a fourth branch laser beam LB4 (p-polarized beam), whose amount of light is a quarter of that of the laser beam LB, to the fourth reflecting mirror 78d. The first through fourth branch laser beams LB1 through LB4 are divided from the laser beam LB, each having an amount of light that is a quarter of that of the laser beam LB, as described above.

Since the first branch laser beam LB1 is an s-polarized beam, after its diameter has been adjusted by the first beam expander 77a, the first branch laser beam LB1 is reflected by the first reflecting mirror 78a toward the fourth beam splitter 79, which guides the first branch laser beam LB1 toward a condensing lens 71a of the beam condenser 71. The second branch laser beam LB2 that is also an s-polarized beam has its diameter adjusted by the second beam expander 77b, and thereafter is reflected by the second reflecting mirror 78b toward the fourth beam splitter 79, which guides the second branch laser beam LB2 toward the condensing lens 71a of the beam condenser 71. Further, the third branch laser beam LB3 that is also an s-polarized beam has its diameter adjusted by the third beam expander 77c, and thereafter is reflected by the third reflecting mirror 78c toward the fourth beam splitter 79, which guides the third branch laser beam LB3 toward the condensing lens 71a of the beam condenser 71. The fourth branch laser beam LB4 reflected by the fourth reflecting mirror 78d is a p-polarized beam and travels straight through the fourth beam splitter 79 to the condensing lens 71a of the beam condenser 71.

The first through third beam expanders 77a through 77c adjust the diameters of the respective first through third branch laser beams LB1 through LB3 such that the adjusted diameters of the respective first through fourth branch laser beams LB1 through LB4 are of the relation of LB1>LB2>LB3>LB4. Further, the angles of the first through fourth reflecting mirrors 78a through 78d are adjusted to form focused spots P1 through P4 of the first through fourth branch laser beams LB1 through LB4 in vertically and horizontally different positions in a downwardly stepped array to the left from the focused spot P4 toward the focused spot P1 within the bonded wafer W on the chuck table 81, as illustrated in FIG. 5. According to the present embodiment, the optical system described above is mainly housed in the horizontal arm 70b of the laser beam applying unit 70. However, the laser oscillator 72 and the attenuator 73 may be disposed in the apparatus housing 2, and the laser beam LB emitted from the laser oscillator 72 may be guided through an optical path provided by optical path changing means including reflecting mirrors, etc., in the vertical rod 70a to the other components of the horizontal arm 70b which are housed in the horizontal arm 70b, for example.

In the focused spot forming unit 74 according to the present embodiment, the laser beam LB from the attenuator 73 is divided into the first through fourth branch laser beams LB1 through LB4, producing the four focused spots P1 through P4 in the wafer laminated W. However, the present invention is not limited to such details. Rather, the focused spot forming unit may include more half-wave plates, beam splitters, beam expanders, and reflecting mirrors to divide the laser beam LB into more branch laser beams, e.g., eight branch laser beams, producing more, e.g., eight, focused spots in a downwardly stepped array in the bonded wafer W.

The processing apparatus 1 includes a controller 100 for controlling various working components thereof. The controller 100 includes a computer and includes a central processing unit (CPU) for performing arithmetic processing operations according to control programs, a read only memory (ROM) for storing the control programs, etc., a read/write random access memory (RAM) for temporarily storing detected values, calculated values, etc., an input interface, and an output interface. Details of the controller 100 are omitted from illustration. The controller 100 includes a coordinate storage section 102 for storing information regarding a processing position 18 in the outer circumferential end portion of the bonded wafer W that is to be processed, e.g., the coordinates of the processing position 18 where the first through fourth branch laser beams LB1 through LB4 are to be applied. The working components that include the X-axis moving mechanism that adjusts the position along the X-axis of the laser beam applying unit 70, the laser beam applying unit 70, and the support 80 are electrically connected to the controller 100. The controller 100 can process the bonded wafer W with laser beams on the basis of the information regarding the processing position 18 stored in the coordinate storage section 102.

As illustrated in FIG. 1, the processing apparatus 1 according to the present embodiment further includes a beveled portion removing device 9 for removing a beveled portion from the bonded wafer W along a modified layer in the bonded wafer W by the processing unit 8. Details of the beveled portion removing device 9 will be described in detail later.

Functions and operation of the processing apparatus 1 arranged as described above will be described below.

Figure 7A:
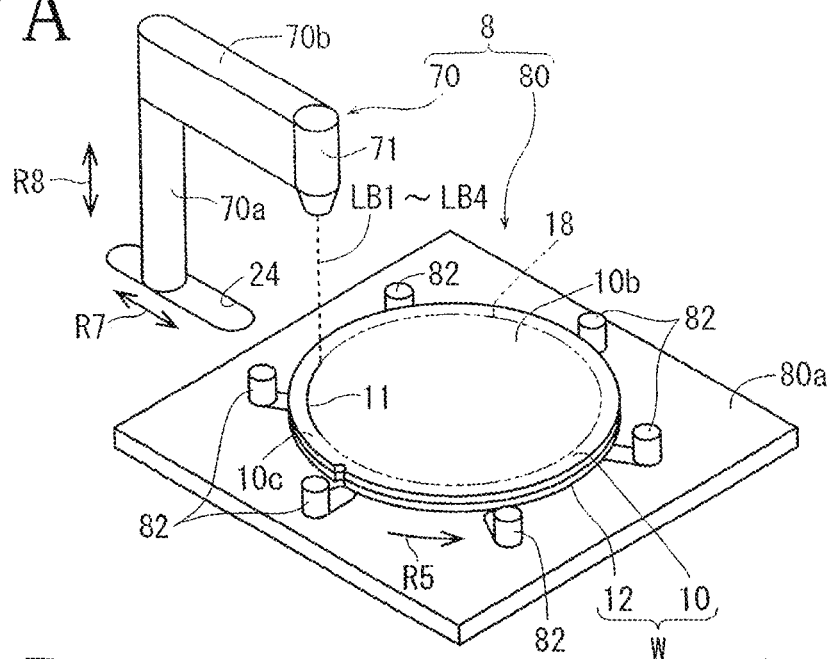
FIG. 7A is a perspective view illustrating the manner in which a laser processing process is carried out by the processing unit illustrated in FIG. 4.

When an instruction to start processing a bonded wafer W is given to the processing apparatus 1, the turntable 5 illustrated in FIG. 1 is turned to position one of the chuck tables 6 that is not holding a bonded wafer W, in the workpiece loading and unloading zone A. Then, the first delivery mechanism 13 is actuated to unload an unprocessed bonded wafer W from the first cassette C1 and place the unprocessed bonded wafer W onto the chuck table 81 of the temporary rest table 80a of the processing unit 8 described above with reference to FIG. 4, with the reverse side 10b of the first wafer 10 to be ground being exposed upwardly. At the time when the bonded wafer W is placed onto the chuck table 81, no negative pressure has been transmitted to the upper surface of the chuck table 81. Then, the pins 82 are moved along the oblong holes 83 toward the center of the chuck table 81, aligning the center of the bonded wafer W with the center of the chuck table 81. After the bonded wafer W has been centered, the suction means fluidly connected to the chuck table 81 is actuated to generate and apply a negative pressure to the upper surface of the chuck table 81, which holds the bonded wafer W under suction thereon, as illustrated in FIG. 7A.

Figure 6:
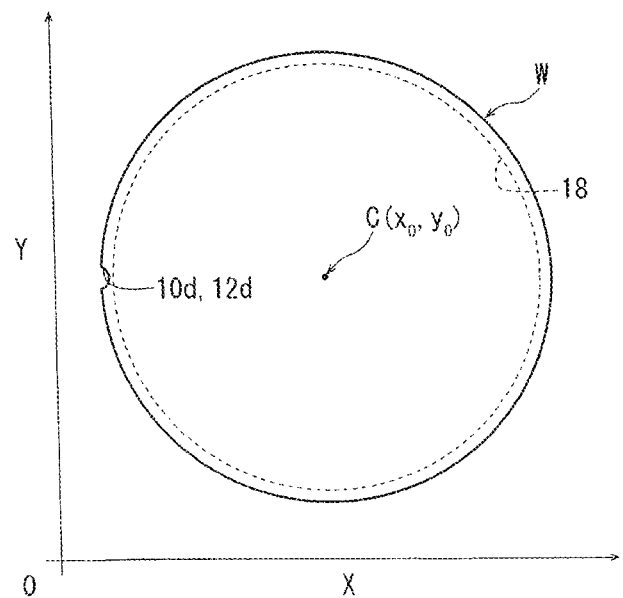
FIG. 6 is a diagram illustrating coordinate information of a processing position which is stored in a coordinate storage section of a controller.
Figure 7B:
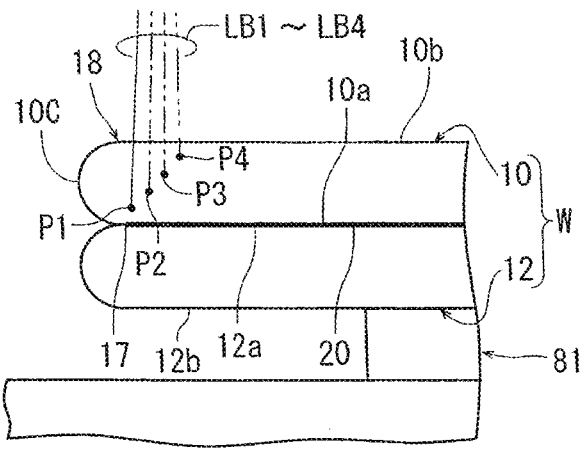
FIG. 7B is an enlarged fragmentary side elevational view illustrating the manner in which a plurality of focused laser beam spots are formed in the wafer by the laser processing process illustrated in FIG. 7A.
Figure 7C:
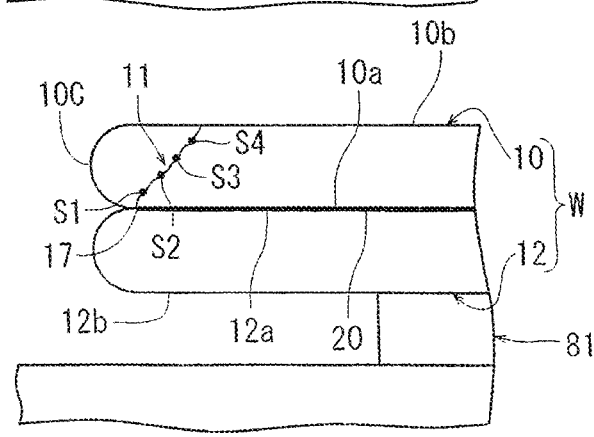
FIG. 7C is an enlarged fragmentary side elevational view illustrating modified layers and cracks formed in the wafer by the laser processing process illustrated in FIG. 7A.

Then, on the basis of the processing position 18 (indicated by a two-dot-and-dash line in FIG. 7A) stored in the coordinate storage section 102 of the controller 100, the vertical rod 70a is horizontally positionally adjusted, by the X-axis moving mechanism, in the directions indicated by the arrow R7 and also horizontally positionally adjusted, by the Z-axis moving mechanism, in the directions indicated by the arrow R8. As illustrated in FIG. 7B, the laser beam applying unit 70 is energized to apply the first through fourth branch laser beams LB1 through LB4 to the first wafer 10 of the bonded wafer W while positioning the focused spots P1 through P4 thereof within the outer circumferential excessive region 10B (see FIGS. 2A and 3A) of the first wafer 10. At the same time, the chuck table 81 is rotated about its vertical central axis in the direction indicated by the arrow R5 in FIG. 7A. As illustrated in FIG. 7B, the processing position 18 is established along an outermost circumferential edge 17 of the joint layer 20. More specifically, in the processing position 18, the focused spots P1 through P4 of the respective first through fourth branch laser beams LB1 through LB4 are positioned in a downwardly stepped array from the uppermost focused spot P4 toward the lowermost focused spot P1 within the outer circumferential excessive region 10B of the first wafer 10 such that the focused spots P1 through P4 are progressively closer radially outwardly to the outermost circumferential edge 17 of the joint layer 20. When the focused spots P1 through P4 are thus positioned, they form respective modified layers S1 through S4 and cracks 11 extending from and along the modified layers S1 through S4 in a spreading pattern toward the face side 10a of the first wafer 10, as illustrated in FIG. 7C. The crack 11 extending from the lowermost modified layer S1 toward the face side 10a of the first wafer 10 reaches a position near the outermost circumferential edge 17 of the joint layer 20. The outermost circumferential edge 17 of the joint layer 20 is positioned approximately 0.5 mm radially inwardly of the outer circumferential edge of the bonded wafer W, and the coordinates of the processing position 18 are established on the circumference of a circle that is spaced approximately 149.5 mm from a center C (see FIG. 6) of the bonded wafer W. Adjacent ones of the focused spots P1 through P4 of the respective first through fourth branch laser beams LB1 through LB4 are spaced horizontally by an interval of 10 μm from each other and vertically by an interval ranging from 1 to 10 μm from each other, for example.

According to the present embodiment, while the laser beam applying unit 70 is being energized, the chuck table 81 of the processing unit 8 is continuously rotated to make two revolutions, so that the first through fourth branch laser beams LB1 through LB4 are applied a plurality of times, i.e., twice, to each location along the processing position 18, making sure that the cracks 11 are produced in the first wafer 10. By thus applying the first through fourth branch laser beams LB1 through LB4, the modified layers S1 through S4 are formed together with the cracks 11 highly accurately within the outer circumferential excessive region 10B of the first wafer 10. After the processing unit 8 has performed the laser processing process as described above, forming the cracks 11 in the outer circumferential excessive region 10B, the beam condenser 71 of the laser beam applying unit 70 of the processing unit 8 is retracted radially outwardly from the bonded wafer W.

Laser processing conditions under which the laser processing process is carried out are established as follows, for example.

Wavelength: 1342 nm
Repetitive frequency: 60 kHz
Output power: 2.4 W
The number of branch laser beams: 4
Chuck table rotational speed: 107.3 deg/s (peripheral speed: 280 mm/s)

After the modified layers S1 through S4 and the cracks 11 for removing the beveled portion 10C have been formed, the beveled portion removing device 9 (see FIGS. 1, 8, 9A, and 9B) is actuated to remove the beveled portion 10C from the first wafer 10. The beveled portion removing device 9 will be described in detail below with reference to FIGS. 1, 8, 9A, and 9B.

Figure 8:
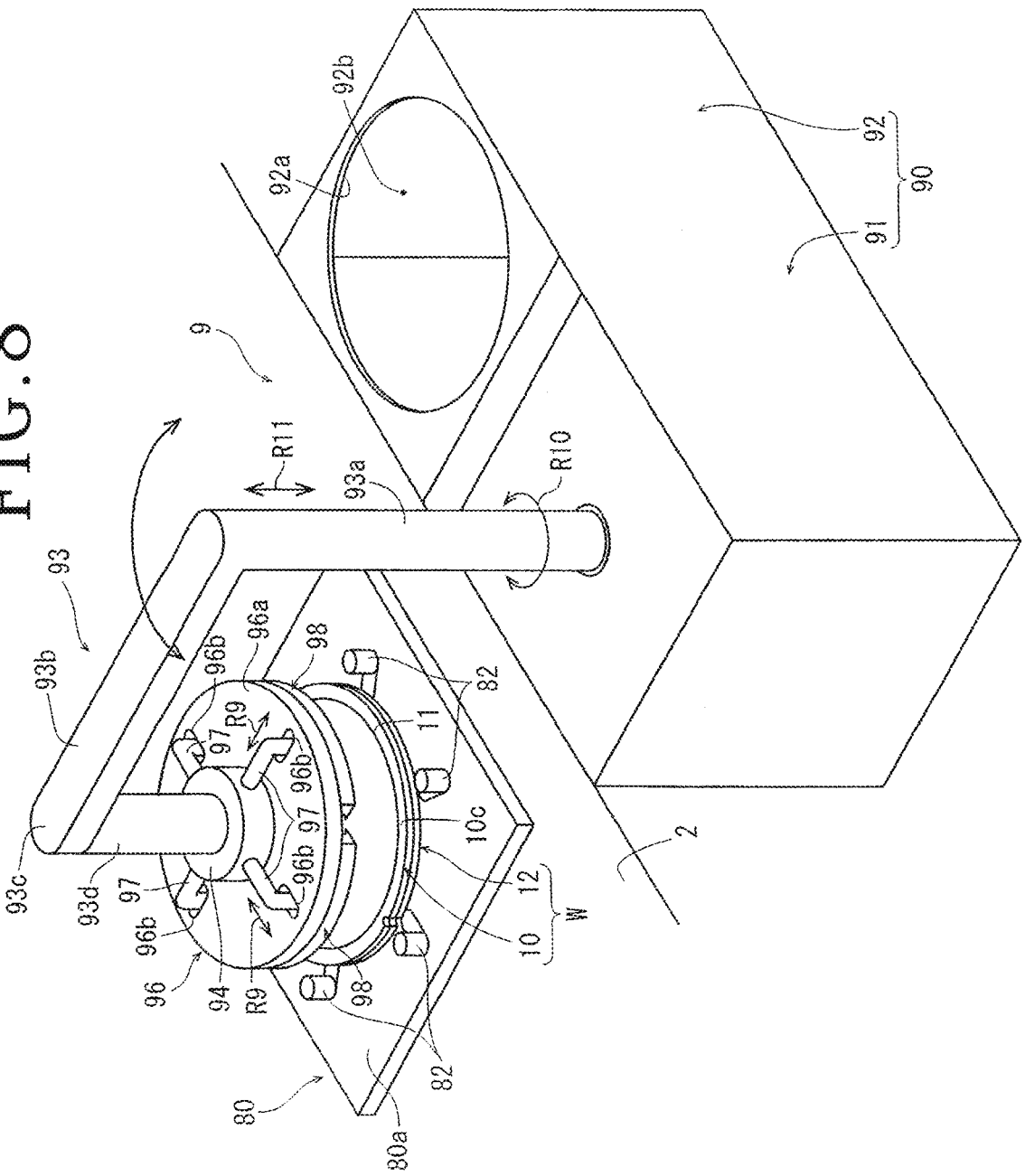
FIG. 8 is a perspective view of a beveled portion removing device for removing a beveled portion.

As illustrated in FIG. 8, the beveled portion removing device 9 includes a device casing 90 and a beveled portion delivery mechanism 93 extending from the device casing 90. The device casing 90 includes a drive mechanism receptacle 91 and a trash box 92. The beveled portion delivery mechanism 93 extends from the drive mechanism receptacle 91 and includes a lifting and lowering vertical rod 93a extending upwardly from the drive mechanism receptacle 91, a horizontal arm 93b extending horizontally from the upper end of the lifting and lowering vertical rod 93a, a hanging rod 93d extending downwardly from a distal end 93c of the horizontal arm 93b, and a beveled portion severing mechanism 96 mounted on the lower end of the hanging rod 93d. The drive mechanism receptacle 91 houses therein a removing means drive mechanism including a rotating mechanism and a lifting and lowering mechanism, which are not depicted. The removing means drive mechanism can rotate and lift and lower the lifting and lowering vertical rod 93a and the horizontal arm 93b to position the beveled portion severing mechanism 96 selectively on the bonded wafer W on the chuck table 81 and over an upper opening 92a in the trash box 92.

The beveled portion severing mechanism 96 includes a drive mechanism 94 mounted on the lower end of the hanging rod 93d, a circular base plate 96a supported on the hanging rod 93d with the drive mechanism 94 interposed therebetween, four support rods 97 that are operatively coupled to the drive mechanism 94 and that are movable by the drive mechanism 94 along respective oblong holes 96b defined in the base plate 96a, in radial directions indicated by an arrows R9, and four grippers 98 coupled to respective distal ends of the support rods 97 beneath the base plate 96a that extend through the respective oblong holes 96b.

FIGS. 9A and 9B illustrate the support rods 97, the base plate 96a, and the grippers 98 in enlarged fragmentary side elevation, partly in cross section. As illustrated in FIGS. 9A and 9B, the gripper 98 coupled to each of the support rods 97 includes a side wall 98a extending downwardly from an outer peripheral end of the gripper 98 and a distal end hook 98b extending obliquely inwardly and downwardly from the lower end of the side wall 98a. The distal end hook 98b is of a sharp pointed cross-sectional shape. Although not illustrated, the side wall 98a and the distal end hook 98b of the gripper 98 are of an arcuate shape along an outer circumferential edge of the base plate 96a.

When the drive mechanism 94 is actuated to move the support rod 97 in a direction indicated by an arrow R11, as illustrated in FIG. 9A, the gripper 98 is moved radially outwardly with respect to the base plate 96a. When the drive mechanism 94 is actuated to move the support rod 97 in a direction indicated by an arrow R12, as illustrated in FIG. 9B, the gripper 98 is moved radially inwardly with respect to the base plate 96a.

The beveled portion severing mechanism 96 operates as follows. As illustrated in FIG. 8, after the modified layers S1 through S4 and the cracks 11 have been formed in the bonded wafer W, the beveled portion delivery mechanism 93 is turned to move the beveled portion severing mechanism 96 to a position above the bonded wafer W supported on the temporary rest table 80a of the processing unit 8. Then, the drive mechanism 94 is actuated to move each support rod 97 in the direction indicated by the arrow R11, as illustrated in FIG. 9A. The four support rods 97 are now spread radially outwardly until a space defined radially inwardly of the distal end hooks 98b is expanded to a size larger than the contour of the bonded wafer W on the chuck table 81. Then, the beveled portion severing mechanism 96 is lowered to position the distal end hook 98b of the gripper 98 at the height of the joint layer 20 between the first wafer 10 and the second wafer 12, as illustrated in FIG. 9A. Then, as illustrated in FIG. 9B, the drive mechanism 94 of the beveled portion severing mechanism 96 is actuated to move the distal end hook 98b toward the joint layer 20. The side wall 98a and the distal end hook 98b are brought into contact with an outer surface of the beveled portion 10C and hold the beveled portion 10C, after which the beveled portion delivery mechanism 93 and hence the beveled portion severing mechanism 96 are lifted. As a result, the distal end hooks 98b that engage the beveled portion 10C are lifted, lifting the beveled portion 10C therewith. The beveled portion 10C is now separated from the first wafer 10 along the cracks 11, thereby severing the first wafer 10 along the cracks 11. As described above with reference to FIG. 7C, inasmuch as the cracks 11 extend from the modified layers S1 through S4 arranged in the downwardly stepped array in the radially outward direction in the first wafer 10, the beveled portion 10C as it is lifted can easily and reliably be separated from the first wafer 10.

After the beveled portion 10C has been separated from the first wafer 10, the beveled portion delivery mechanism 93 turned to move the beveled portion severing mechanism 96 to a position over the upper opening 92a in the trash box 92. Then, the drive mechanism 94 is actuated to move the grippers 98 radially outwardly, releasing the beveled portion 10C downwardly through the upper opening 92a into the trash box 92. After the beveled portion 10C has been discarded in the trash box 92, the beveled portion delivery mechanism 93 remains in the position above the trash box 92, as illustrated in FIG. 1.

After the beveled portion 10C has been removed from the bonded wafer W held on the temporary rest table 80a of the processing unit 8, the second delivery mechanism 14 (see FIG. 1) is actuated to deliver the bonded wafer W from the temporary rest table 80a onto one of the chuck tables 6 that is positioned in the workpiece loading and unloading zone A, in which the bonded wafer W is placed and held under suction on the chuck table 6 with the second wafer 12 beneath the first wafer 10 and facing downwardly. Then, the turntable 5 is turned about its vertical central axis in the direction indicated by the arrow R3 to move the chuck table 6 from the workpiece loading and unloading zone A to the coarsely grinding zone B, in which the chuck table 6 is positioned directly below the coarsely grinding unit 3, as illustrated in FIG. 10A. In the coarsely grinding zone B, the coarsely grinding unit 3 performs a coarsely finishing process on the bonded wafer W. Specifically, the rotational shaft 32 of the coarsely grinding unit 3 is rotated about its central axis in the direction indicated by the arrow R1 at a speed of 6000 rpm, for example, while, at the same time, the chuck table 6 is rotated about its vertical central axis in the direction indicated by the arrow R4 at a speed of 300 rpm, for example. While the grinding water supply unit is supplying the grinding water H to the lower surface of the grinding wheel 34 and the coarse grindstones 35 mounted thereon and hence to the reverse side 10b of the first wafer 10, the grinding wheel 34 is lowered, i.e., grinding-fed at a grinding feed speed of 1 µm/s, for example, to cause the coarse grindstones 35 to coarsely grind the reverse side 10b of the first wafer 10 in abrasive contact therewith. At this time, the thickness of the bonded wafer W is measured by an undepicted contact-type or non-contact-type thickness measurement gauge. Therefore, the bonded wafer W can be thinned to a desired thickness as measured by the thickness measurement gauge, by thus grinding the reverse side 10b of the first wafer 10, as illustrated in FIG. 10B.

After the bonded wafer W has been coarsely ground by the coarsely grinding unit 3, the coarsely grinding unit 3 is shut down. Then, the turntable 5 is turned about its vertical central axis in the direction indicated by the arrow R3, to move the chuck table 6 with the bonded wafer W held thereon, from the coarsely grinding zone B to the finishingly grinding zone C, in which the chuck table 6 is positioned directly below the finishingly grinding unit 4. In the finishingly grinding zone C, the finishingly grinding unit 4 performs a finishingly grinding process on the bonded wafer W. Since the finishingly grinding process is basically similar to the coarsely grinding process except that the finishing grindstones 45 are used instead of the coarse grindstones 35, the finishingly grinding process will not be described in detail below. Before the turntable 5 is turned to move the chuck table 6 with the coarsely ground bonded wafer W held thereon, from the coarsely grinding zone B to the finishingly grinding zone C, an unground bonded wafer W whose beveled portion 10C has been removed is placed and held under suction on the chuck table 6 in the workpiece loading and unloading zone A. In this manner, when the turntable 5 is turned in the direction indicated by the arrow R3, the bonded wafers W are brought respectively to the coarsely grinding zone B and the finishingly grinding zone C and hence are coarsely and finishingly ground respectively by the coarsely grinding unit 3 and the finishingly grinding unit 4. Thereafter, when the turntable 5 is turned in the direction indicated by the arrow R3, the bonded wafer W that has been finishingly ground in the finishingly grinding zone C is moved to and positioned in the workpiece loading and unloading zone A. The bonded wafer W that has been finishingly ground is delivered by the third delivery mechanism 15 from the workpiece loading and unloading zone A to the cleaning unit 7, in which the bonded wafer W is cleaned and dried. Then, the cleaned bonded wafer W is delivered by the first delivery mechanism 13 from the cleaning unit 7 to the second cassette C2, in which the bonded wafer W is stored.

According to the present embodiment, no knife edge is formed on the first wafer 10 of the bonded wafer W when the reverse side 10b of the first wafer 10 is finishingly and coarsely ground. Therefore, an operator is prevented from being injured, and cracks are prevented from unduly developing into the first wafer 10 and causing damage to device chips to be fabricated from the first wafer 10. Further, as the processing apparatus 1 includes the processing unit 8 for forming modified layers and cracks in bonded wafers W with laser beams and the beveled portion severing mechanism 96 for removing beveled portions from bonded wafers W, the processing apparatus 1 can efficiently remove beveled portions from bonded wafers W. In addition, the processing apparatus 1 achieves increased productivity because it is free of the trouble of delivering a cassette storing wafers whose beveled portions have been removed to a separate grinding apparatus.

Moreover, inasmuch as the beveled portion removing device 9 for removing the annular beveled portion 10C of the first wafer 10 by forming the cracks 11 from and along the modified layers S1 through S4 formed by the processing unit 8 is disposed adjacent to the processing unit 8, the processing apparatus 1 is able to efficiently retrieve the removed annular beveled portion 10C in the trash box 92 for increased productivity.

The present invention is not limited to the embodiment described above. For example, although the processing apparatus 1 according to the illustrated embodiment includes the coarsely grinding unit 3 and the finishingly grinding unit 4 for successively coarsely grinding and finishingly grinding the bonded wafer W, the processing apparatus according to the present invention may have a single grinding unit.

According to the illustrated embodiment, the laser beam applying unit 70 includes the optical system having the half-wave plates, the beam splitters, the beam expanders, and the reflecting mirrors. However, the present invention is not limited to such details. The focused spot forming unit 74 illustrated in FIG. 5 may be replaced with a spatial optical modulator made of a liquid crystal on silicon (LCOS) for dividing the laser beam LB emitted from the laser oscillator 72, into a plurality of branch laser beams having respective focused spots P1 through P4 that are formed in a downwardly stepped array within the first wafer 10 in such a manner as to be progressively closer radially outwardly to the joint layer 20 for forming the modified layers S1 through S4 at the focused spots P1 through P4 in the first wafer 10 and the cracks 11 extending from and along the modified layers S1 through S4 in a spreading pattern toward the face side 10a of the first wafer 10.

According to the embodiment described above, after the modified layers S1 through S4 and the cracks 11 have been formed in the first wafer 10 by the laser beams LB1 through LB4 emitted from the laser beam applying unit 70, the beveled portion removing device 9 is actuated to remove the beveled portion 10C from the first wafer 10 before the first wafer 10 is ground. However, the present invention is not limited to such details. The beveled portion removing device 9 may not be actuated or may be dispensed with, and the first wafer 10 may be ground with the beveled portion 10C remaining unremoved therefrom. The beveled portion 10C left in the first wafer 10 are broken and removed from the first wafer 10 by external forces that are applied to the modified layers S1 through S4 and the cracks 11 while the first wafer 10 is being ground.

According to the embodiment described above, the processing unit 8 processes the bonded wafer W to remove the beveled portion 10C on the outer circumference of the first wafer 10. However, the present invention does not preclude a process of grinding the reverse side 10b of the first wafer 10 before the process for removing the beveled portion 10C on the outer circumference of the first wafer 10, i.e., before the modified layers S1 through S4 illustrated in FIG. 7C are formed in the first wafer 10. A modification of the above embodiment will be described below with reference to FIG. 11. According to the modification, the processing unit 8 illustrated in FIG. 4 is replaced with a processing unit 8' illustrated in FIG. 11. Stated otherwise, the processing unit 8' is incorporated instead of the processing unit 8 in the processing apparatus 1. The other details of the processing apparatus 1 remain unchanged and will not be described in detail below.

Figure 11:
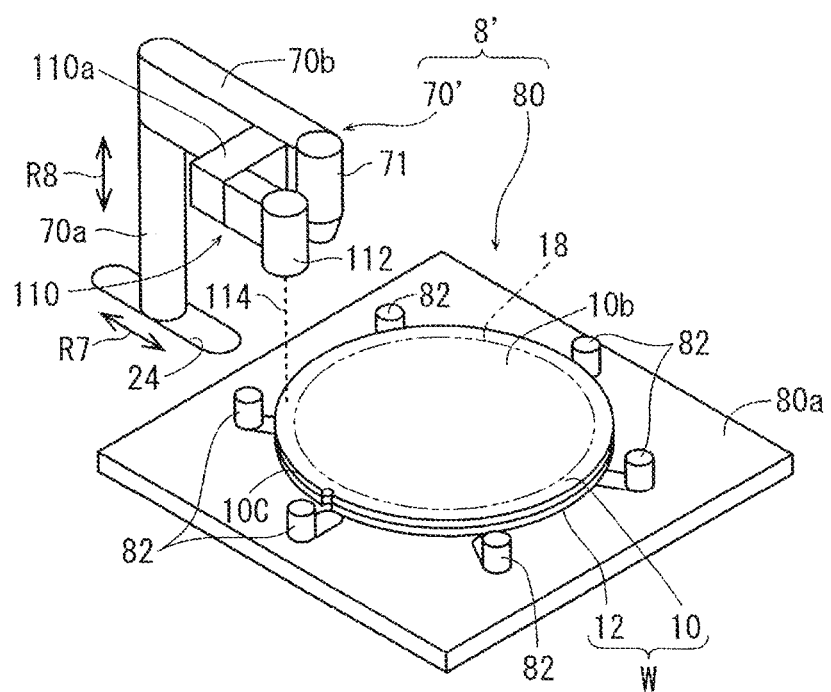
FIG. 11 is a perspective view of a processing unit according to a modification of the embodiment, the processing unit including an electric resistance measuring instrument.

FIG. 11 illustrates in perspective the processing unit 8' included in place of the processing unit 8 in the processing apparatus 1. The processing unit 8' includes a laser beam applying unit 70' and a support 80. The support 80 is identical in structure to the support 80 illustrated in FIG. 4 and will be omitted from detailed description below.

As with the laser beam applying unit 70 described above, the laser beam applying unit 70' includes a vertical rod 70a, a horizontal arm 70b extending horizontally from the upper end of the vertical rod 70a in overhanging relation to the support 80, a beam condenser 71 disposed on the distal end of the horizontal arm 70b, and an optical system that is identical to the optical system of the laser beam applying unit 70. The laser beam applying unit 70' further includes an electric resistance measuring instrument 110 disposed adjacent to and extending parallel to the beam condenser 71, for measuring the electric resistivity of a workpiece, i.e., the bonded wafer W. The electric resistance measuring instrument 110 is non-contact-type means for measuring the electric resistivity and includes a sensor 112 mounted on the lower distal end of a branch arm 110a joined to the arm 70b. The sensor 112 includes an undepicted coil therein, for example. When an electric current flows through the coil, the coil generates a magnetic field 114. When the magnetic field 114 is brought closely to the first wafer 10 of the bonded wafer W, it generates an eddy current in the first wafer 10. At this time, the sensor 112 senses an electric loss in the first wafer 10 on the basis of the eddy current, thereby measuring the electric resistivity of the bonded wafer W. The value of the electric resistivity measured by the electric resistance measuring instrument 110 is sent to the controller 100 and stored in a storage device of the controller 100.

The vertical rod 70a is horizontally movable by an undepicted X-axis moving mechanism in the directions indicated by the arrow R7 in and along a slot 24 defined in the apparatus housing 2 along the X-axis. The vertical rod 70a is vertically movable by an undepicted Z-axis moving mechanism in the directions indicated by the arrow R8. Therefore, the vertical rod 70a can be moved to position the beam condenser 71 mounted on the distal end of the horizontal arm 70b and the electric resistance measuring instrument 110, at respective desired positions along the X-axis and the Z-axis over the temporary rest table 80a. The slot 24 has a longitudinal central axis aligned with the center of the chuck table 81 such that the beam condenser 71 can be moved on and along a line extending through the center of the chuck table 81 across the outer circumferential edge of a bonded wafer W placed on the chuck table 81.

A process of processing the bonded wafer W on the processing apparatus 1 that includes the processing unit 8' according to the modification will be described below. First, the first delivery mechanism 13 is actuated to unload an unprocessed bonded wafer W from the first cassette C1, deliver the unprocessed bonded wafer W to the temporary rest table 80a of the processing unit 8', and place the unprocessed bonded wafer W on the chuck table 81 (see FIG. 4), with the reverse side 10b of the first wafer 10 to be ground being exposed upwardly. The respective thicknesses of the first wafer 10 and the second wafer 12 of the bonded wafer W have been measured in advance and stored in the controller 100. At the time when the bonded wafer W is placed onto the chuck table 81, no negative pressure has been transmitted to the upper surface of the chuck table 81. Then, the pins 82 are moved along the oblong holes 83 toward the center of the chuck table 81, aligning the center of the bonded wafer W with the center of the chuck table 81.

For removing the beveled portion 10C on the outer circumference of the first wafer 10 with the processing unit 8', as described above with reference to the embodiment, the laser beams LB1 through LB4 whose wavelength is transmittable through the first wafer 10 are applied to the first wafer 10 while their focused spots P1 through P4 are being positioned at respective predetermined depths in the first wafer 10, forming modified layers S1 through S4 and cracks 11 in the first wafer 10 along which to remove the beveled portion 10C. However, if the electric resistivity of the first wafer 10 is too low with respect to the depths at which the modified layers S1 through S4 are to be formed in the first wafer 10, the electric resistivity may adversely affect the transmittance for the laser beams LB1 through LB4, failing to form the modified layers S1 through S4 and the cracks 11 appropriately at the predetermined depths in the first wafer 10. In that case, it is necessary to grind the bonded wafer W to a thickness not impairing the formation of the modified layers S1 through S4 and the cracks 11 at desired depths in the first wafer 10 depending on the measured electric resistivity.

For measuring the electric resistivity of the first wafer 10, the X-axis moving mechanism and the Z-axis moving mechanism are actuated to move the laser beam applying unit 70' to position the sensor 112 of the electric resistance measuring instrument 110 over the upper surface of the first wafer 10 of the bonded wafer W. Then, the electric resistance measuring instrument 110 is energized to measure the electric resistivity of the first wafer 10. The electric resistance measuring instrument 110 transmits the measured value of the electric resistivity to the controller 100 where the measured value is stored in the storage device. The controller 100 then determines whether or not the measured value of the electric resistivity impairs the formation of the modified layers S1 through S4 and the cracks 11 at desired depths in the first wafer 10.

If the controller 100 decides that the measured electric resistivity impairs the formation of the modified layers S1 through S4 and the cracks 11, then, since the modified layers S1 through S4 and the cracks 11 cannot be formed at desired depths in the first wafer 10 by the laser beams LB1 through LB4 emitted from the laser beam applying unit 70', the reverse side 10b of the first wafer 10 is ground before the processing unit 8' performs its process of forming the modified layers S1 through S4 and the cracks 11 in the outer circumferential excessive region 10B of the first wafer 10. The process of grinding the reverse side 10b of the first wafer 10 is continued until the first wafer 10 is ground to a thickness that allows the modified layers S1 through S4 and the cracks 11 to be formed appropriately at the predetermined depths in the first wafer 10.

The grinding process before the processing unit 8' performs its process of forming the modified layers S1 through S4 and the cracks 11 in the first wafer 10 is carried out by the processing apparatus 1 in the manner described above according to the embodiment, and hence will not be described in detail below. A target thickness to which the first wafer 10 is to be thinned down by the grinding process should preferably be established on the basis of the electric resistivity of the first wafer 10 measured by the electric resistance measuring instrument 110. Specifically, the controller 100 sets the target thickness to a value that allows the modified layers S1 through S4 and the cracks 11 to be formed appropriately at the predetermined depths in the first wafer 10.

The grinding process to be performed on the reverse side 10b of the first wafer 10 before the processing unit 8' performs its process of forming the modified layers S1 through S4 and the cracks 11 in the first wafer 10 may not necessarily be carried out by both the coarsely grinding unit 3 and the finishingly grinding unit 4, and may be carried out by either one of the coarsely grinding unit 3 and the finishingly grinding unit 4. For example, if the reverse side 10b of the first wafer 10 is to be ground off by a small amount, then it may be ground only by the finishingly grinding unit 4. On the other hand, if the reverse side 10b of the first wafer 10 has been coarsely ground by the coarsely grinding unit 3 to a level of surface roughness that allows the modified layers S1 through S4 and the cracks 11 to be formed appropriately by the laser beams LB1 through LB4 applied thereto, then the reverse side 10b of the first wafer 10 may not additionally be coarsely ground by the finishingly grinding unit 4.

When the grinding process has been performed on the reverse side 10b of the first wafer 10 before the processing unit 8' performs its process of forming the modified layers S1 through S4 and the cracks 11 in the first wafer 10, the turntable 5 of the processing apparatus 1 is turned about its vertical central axis in the direction indicated by the arrow R3 to move the chuck table 6 with the processed bonded wafer W held thereon to the workpiece loading and unloading zone A. Then, the second delivery mechanism 14 is actuated to unload the bonded wafer W from the chuck table 6 positioned in the workpiece loading and unloading zone A, and place the bonded wafer W onto the temporary rest table 80a of the support 80 where the bonded wafer W is centered. Then, the suction means is actuated, generating a negative pressure that is transmitted to the upper surface of the chuck table 81 for thereby holding a bonded wafer W under suction thereon. The laser beam applying unit 70' is energized to apply the laser beams LB1 through LB4 to the first wafer 10, as illustrated in FIGS. 7A and 7B, thereby forming the modified layers S1 through S4 and the cracks 11 in the first wafer 10, as illustrated in FIG. 7C.

After the modified layers S1 through S4 and the cracks 11 have been formed in the first wafer 10, the beveled portion delivery mechanism 93 is actuated to remove the beveled portion 10C from the first wafer 10, and the coarsely grinding unit 3 and the finishingly grinding unit 4 are actuated to grind the reverse side 10b of the first wafer 10 and thin down the first wafer 10 to a desired thickness, in the same manner as with the embodiment described above with reference to FIGS. 8 through 10B. The process of removing the beveled portion 10C and the process of grinding the reverse side 10b of the first wafer 10 will be omitted from detailed description below.

If the controller 100 decides that the measured electric resistivity is high enough not to impair the formation of the modified layers S1 through S4 and the cracks 11, then the controller 100 decides that it is possible for the processing unit 8' to form the modified layers S1 through S4 and the cracks 11 appropriately at the predetermined depths in the first wafer 10 without grinding the reverse side 10b of the first wafer 10. Therefore, the grinding process is not carried out. Then, the processing unit 8' forms the modified layers S1 through S4 and the cracks 11 in the outer circumferential excessive region 10B of the first wafer 10. Thereafter, the beveled portion delivery mechanism 93 is actuated to remove the beveled portion 10C from the first wafer 10, and the coarsely grinding unit 3 and the finishingly grinding unit 4 are actuated to grind the reverse side 10b of the first wafer 10 and thin down the first wafer 10 to a desired thickness. The process of removing the beveled portion 10C and the process of grinding the reverse side 10b of the first wafer 10 will be omitted from detailed description below.

According to the present modification, as described above, the electric resistivity of the first wafer 10 is measured, and it is determined whether or not the measured electric resistivity impairs the formation of the modified layers S1 through S4 and the cracks 11 at desired depths in the first wafer 10. If it is decided that the measured electric resistivity impairs the formation of the modified layers S1 through S4 and the cracks 11 at desired depths in the first wafer 10, then the grinding process is performed on the reverse side 10b of the first wafer 10 prior to the process carried out by the processing unit 8' of removing the beveled portion 10C of the outer circumferential excessive region 10B of the first wafer 10. The first wafer 10 is now thinned down to an appropriate thickness depending on the electric resistivity of the first wafer 10, so that processing failures will be prevented from occurring at the time of forming the modified layers S1 through S4 and the cracks 11 in the first wafer 10 for the removal of the beveled portion 10C.

According to the modification, as described above, the electric resistance measuring instrument 110 included in the processing unit 8' is non-contact-type means for measuring the electric resistivity of the first wafer 10 of the bonded wafer W placed on the temporary rest table 80a. However, the electric resistance measuring instrument 110 is not limited to non-contact-type measuring means. The electric resistance measuring instrument 110 may alternatively be known contact-type means for measuring the electric resistivity of the first wafer 10 of the bonded wafer W placed on the temporary rest table 80a. The wafer W as the workpiece to be processed is not limited to the bonded wafer including the first wafer 10 and the second wafer 12 that are stacked together, and may alternatively be a single-layer wafer that includes only the first wafer 10.

The present invention is not limited to the illustrated modification in which the processing unit 8' included in the processing apparatus 1 includes the electric resistance measuring instrument 110 that measures the electric resistivity of the first wafer 10. The processing apparatus 1 that includes the processing unit 8 illustrated in FIGS. 4 and 7A through 7C may be modified as follows. Before an unprocessed bonded wafer W is loaded into the processing apparatus 1, the electric resistivity of the first wafer 10 of the unprocessed bonded wafer W is measured, and information regarding the measured electric resistivity of the first wafer 10 is sent to and stored in the controller 100. If the controller 100 decides that the measured electric resistivity of the first wafer 10 impairs the formation of the modified layers S1 through S4 and the cracks 11 by the processing unit 8, on the basis of the stored information regarding the measured electric resistivity, then, before the processing unit 8 performs its process of removing the beveled portion 10C of the outer circumferential excessive region 10B of the first wafer 10, the grinding process is performed on the first wafer 10 to thin down the first wafer to a thickness that allows the modified layers S1 through S4 and the cracks 11 to be formed in the first wafer 10 by the laser beam applying unit 70.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus for processing a wafer including in a face side thereof a device region containing a plurality of devices therein and an outer circumferential excessive region including a beveled portion on an outer circumferential end portion thereof, the processing apparatus comprising:
   a chuck table for holding the wafer thereon;
   a grinding unit for grinding the wafer held on the chuck table;
   a cleaning unit for cleaning the wafer; and
   a controller;
   a processing unit, wherein the controller is configured to control the processing unit to perform a process of removing the beveled portion of the outer circumferential end portion of the wafer before the grinding unit grinds the wafer,
   wherein the processing unit includes a support for supporting the wafer with a surface thereof being exposed and a laser beam applying unit for emitting a laser beam having a wavelength transmittable through the wafer, and
   wherein the controller is configured to control the laser beam applying unit to apply the laser beam to the wafer supported on the support, from the exposed surface, while positioning a focused spot thereof within the outer circumferential excessive region of the wafer, to form a modified layer in the wafer along which to remove the beveled portion from the wafer.

2. The processing apparatus according to claim 1, wherein the laser beam applying unit applies a plurality of laser beams to the wafer while forming respective focused spots thereof in a downwardly stepped array from an uppermost one toward a lowermost one of the focused spots within the wafer in such a manner as to be progressively closer outwardly of the wafer to another surface, opposite the exposed surface, of the wafer.

3. The processing apparatus according to claim 2, wherein a crack extending from the lowermost one of the focused spots is formed in the wafer and reaches the other surface of the wafer.

4. The processing apparatus according to claim 1, further comprising:
   a cassette table for holding a cassette placed thereon, the cassette storing a plurality of wafers therein;
   a first delivery mechanism for delivering a wafer from the cassette placed on the cassette table;
   a temporary rest table for temporarily holding the wafer delivered from the cassette by the first delivery mechanism; and
   a second delivery mechanism for delivering the wafer from the temporary rest table to the chuck table.

5. The processing apparatus according to claim 4, wherein the support of the processing unit includes the temporary rest table, and the laser beam applying unit is disposed adjacent to the temporary rest table.

6. The processing apparatus according to claim 1, further comprising:
   a beveled portion removing device for removing the beveled portion along the modified layer formed by the processing unit, the beveled portion removing device being disposed adjacent to the processing unit.

7. The processing apparatus according to claim 1,
wherein the wafer comprises a bonded wafer having a first wafer including in a face side thereof a device region containing a plurality of devices therein and an outer circumferential excessive region including a beveled portion on an outer circumferential end portion thereof, and a second wafer having a face side and a reverse side thereof, the face side or the reverse side of the second wafer being affixed to the face side of the first wafer by a joint layer interposed therebetween.

8. The processing apparatus according to claim 1,
wherein, if it is decided that electric resistivity of the wafer impairs formation of the modified layer by the processing unit, then a grinding process is performed on a reverse side, opposite the face side, of the wafer before the processing unit performs the process of removing the beveled portion of the outer circumferential end portion of the wafer.

9. The processing apparatus according to claim 8, further comprising:
an electric resistance measuring instrument for measuring the electric resistivity of the wafer,
wherein it is determined whether or not the electric resistivity of the wafer measured by the electric resistance measuring instrument impairs the formation of the modified layer by the processing unit, and if it is decided that the electric resistivity of the wafer is of a value that impair the formation of the modified layer by the processing unit, then the grinding process is performed on the reverse side of the wafer before the processing unit performs the process of removing the beveled portion of the outer circumferential end portion of the wafer.

10. The processing apparatus according to claim 9,
wherein the grinding process performed on the reverse side of the wafer before the processing unit performs the process of removing the beveled portion of the outer circumferential end portion of the wafer is continued until the wafer is ground to a thickness enough to decide that the electric resistivity of the wafer does not impair the formation of the modified layer.

11. A processing apparatus for processing a wafer including in a face side thereof a device region containing a plurality of devices therein and an outer circumferential excessive region including a beveled portion on an outer circumferential end portion thereof, the processing apparatus comprising:
a chuck table for holding the wafer thereon;
a grinding unit for grinding the wafer held on the chuck table;
a cleaning unit for cleaning the wafer; and
a controller;
a processing unit, wherein the controller is configured to control the processing unit to remove the beveled portion of the outer circumferential end portion of the wafer before the grinding unit grinds the wafer,
wherein the processing unit includes a support for supporting the wafer with a surface thereof being exposed and a laser beam applying unit for emitting a laser beam having a wavelength transmittable through the wafer, and
wherein the controller is configured to control the laser beam applying unit to apply the laser beam to the wafer supported on the support, from the exposed surface, while positioning a focused spot thereof within the outer circumferential excessive region of the wafer, to form a modified layer in the wafer along which to remove the beveled portion from the wafer.

12. The processing apparatus according to claim 11,
wherein the laser beam applying unit applies a plurality of laser beams to the wafer while forming respective focused spots thereof in a downwardly stepped array from an uppermost one toward a lowermost one of the focused spots within the wafer in such a manner as to be progressively closer outwardly of the wafer to another surface, opposite the exposed surface, of the wafer.

13. The processing apparatus according to claim 12,
wherein a crack extending from the lowermost one of the focused spots is formed in the wafer and reaches the other surface of the wafer.

14. The processing apparatus according to claim 11, further comprising:
a beveled portion removing device that removes the beveled portion along the modified layer formed by the processing unit, the beveled portion removing device being disposed adjacent to the processing unit.

15. The processing apparatus according to claim 11,
wherein the wafer comprises a bonded wafer having a first wafer including in a face side thereof a device region containing a plurality of devices therein and an outer circumferential excessive region including a beveled portion on an outer circumferential end portion thereof, and a second wafer having a face side and a reverse side thereof, the face side or the reverse side of the second wafer being affixed to the face side of the first wafer by a joint layer interposed therebetween.

16. The processing apparatus according to claim 11,
further comprising a controller coupled to an electric resistivity sensor, wherein if it is decided by the controller that electric resistivity of the wafer impairs formation of the modified layer by the processing unit, then the controller controls the grinding unit to perform a grinding process on a reverse side, opposite the face side, of the wafer before the processing unit performs the process of removing the beveled portion of the outer circumferential end portion of the wafer.

17. The processing apparatus according to claim 16, further comprising:
wherein it is determined by the controller whether or not the electric resistivity of the wafer measured by the electric resistivity sensor impairs the formation of the modified layer by the processing unit, and if it is decided by the controller that the electric resistivity of the wafer is of a value that impair the formation of the modified layer by the processing unit, then the controller controls the grinding unit to perform the grinding process on the reverse side of the wafer before the processing unit performs the process of removing the beveled portion of the outer circumferential end portion of the wafer.

18. The processing apparatus according to claim 17,
wherein the controller controls the grinding process performed on the reverse side of the wafer before the processing unit performs the process of removing the beveled portion of the outer circumferential end portion of the wafer is continued until the wafer is ground to a thickness enough to decide that the electric resistivity of the wafer does not impair the formation of the modified layer.

19. A processing apparatus for processing a wafer including in a face side thereof a device region containing a plurality of devices therein and an outer circumferential excessive region including a beveled portion on an outer circumferential end portion thereof, the processing apparatus comprising:
- a chuck table for holding the wafer thereon;
- a grinding unit for grinding the wafer held on the chuck table;
- a cleaning unit for cleaning the wafer; and
- a controller;
- a processing unit, wherein the controller is configured to control the processing unit to perform a process of removing the beveled portion of the outer circumferential end portion of the wafer,
- wherein the processing unit includes a support for supporting the wafer with a surface thereof being exposed and a laser beam applying unit for emitting a laser beam having a wavelength transmittable through the wafer, and
- wherein the controller is configured to control the laser beam applying unit to apply the laser beam to the wafer supported on the support, from the exposed surface, while positioning a focused spot thereof within the outer circumferential excessive region of the wafer, to form a modified layer in the wafer along which to remove the beveled portion from the wafer.

20. The processing apparatus according to claim 19, wherein, if it is decided that electric resistivity of the wafer impairs formation of the modified layer by the processing unit, then a grinding process is performed on a reverse side, opposite the face side, of the wafer before the processing unit performs the process of removing the beveled portion of the outer circumferential end portion of the wafer.

\* \* \* \* \*